(12) United States Patent
Fournel et al.

(10) Patent No.: US 12,227,679 B2
(45) Date of Patent: Feb. 18, 2025

(54) SURFACE ACTIVATED BONDING METHOD BY ION OR ATOM BOMBARDMENT OF A FIRST SURFACE OF A FIRST SUBSTRATE TO A SECOND SURFACE OF A SECOND SUBSTRATE

(71) Applicant: COMMISSARIAT À L'ENERGIE ATOMIQUE ET AUX ENERGIES ALTERNATIVES, Paris (FR)

(72) Inventors: Frank Fournel, Grenoble (FR); Karine Abadie, Grenoble (FR); Quentin Lomonaco, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 118 days.

(21) Appl. No.: 18/175,882

(22) Filed: Feb. 28, 2023

(65) Prior Publication Data
US 2023/0272243 A1 Aug. 31, 2023

(30) Foreign Application Priority Data
Feb. 28, 2022 (FR) .................................... 2201744

(51) Int. Cl.
*H01L 21/18* (2006.01)
*C09J 5/04* (2006.01)

(52) U.S. Cl.
CPC .............. *C09J 5/04* (2013.01); *H01L 21/187* (2013.01); *C09J 2301/416* (2020.08); *C09J 2400/10* (2013.01)

(58) Field of Classification Search
CPC ..................................................... H01L 21/187
See application file for complete search history.

(56) References Cited

U.S. PATENT DOCUMENTS

| 2017/0133347 A1 | 5/2017 | Moriceau et al. |
| 2020/0152597 A1* | 5/2020 | Fournel ................. H01L 21/187 |

FOREIGN PATENT DOCUMENTS

| EP | 1 208 593 A1 | 5/2002 |
| WO | WO 01/15218 A1 | 3/2001 |

OTHER PUBLICATIONS

Search Report as issued in French Patent Application No. FR2201744, dated Oct. 12, 2022.

(Continued)

*Primary Examiner* — Scott W Dodds
(74) *Attorney, Agent, or Firm* — Pillsbury Winthrop Shaw Pittman LLP

(57) ABSTRACT

A surface activated bonding method by ion or atom bombardment of a first surface of a first substrate to a second surface of a second substrate, the material of the first substrate at the first surface including at least two chemical species, one of which, called the species of interest, becomes depleted upon activation by ion or atom bombardment, the method including depositing a layer of the species of interest onto the first surface of the first substrate; activating the first surface by bombarding the first surface with an ion or atom beam so as to consume the entire previously deposited layer of species; and activating the second surface by bombarding the second surface with an ion or atom beam; and contacting the first surface of the first substrate with the second surface of the second substrate.

8 Claims, 2 Drawing Sheets

(56) References Cited

OTHER PUBLICATIONS

Takagi, H., et al., "Surface activated bonding of silicon wafers at room temperature," Applied Physics Letters, vol. 68, No. 16, Apr. 1996, XP012015052, pp. 2222-2224.
Gösele, U., et al., "Semiconductor Wafer Bonding," Annual Review of Materials Science, vol. 28, No. 1, Aug. 1998, XP055032047, pp. 215-242.

* cited by examiner

[Fig. 1]
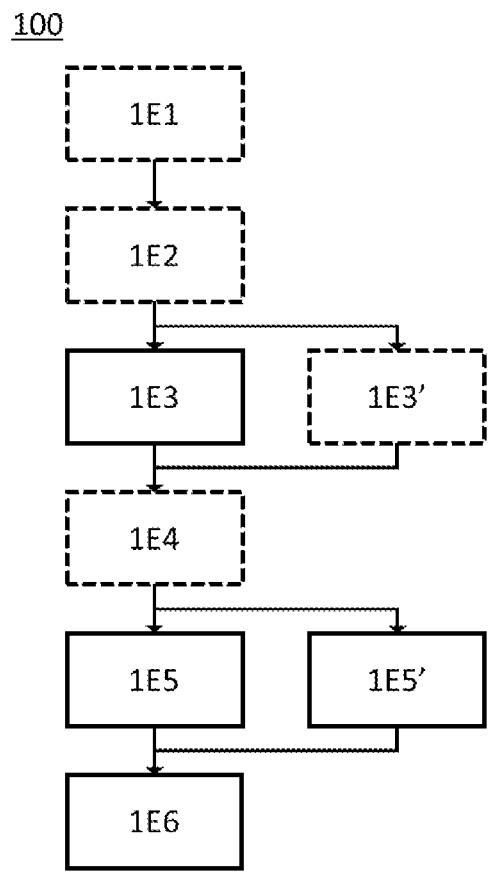
[Fig. 2]
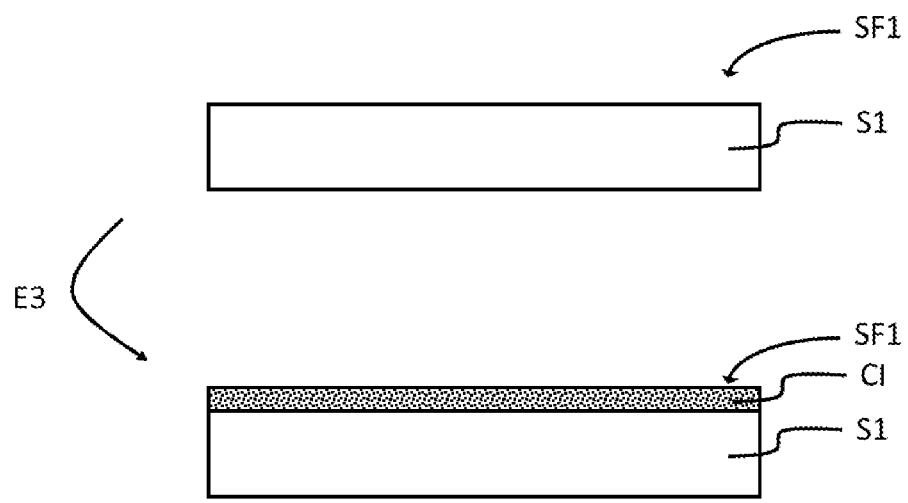

[Fig. 3]
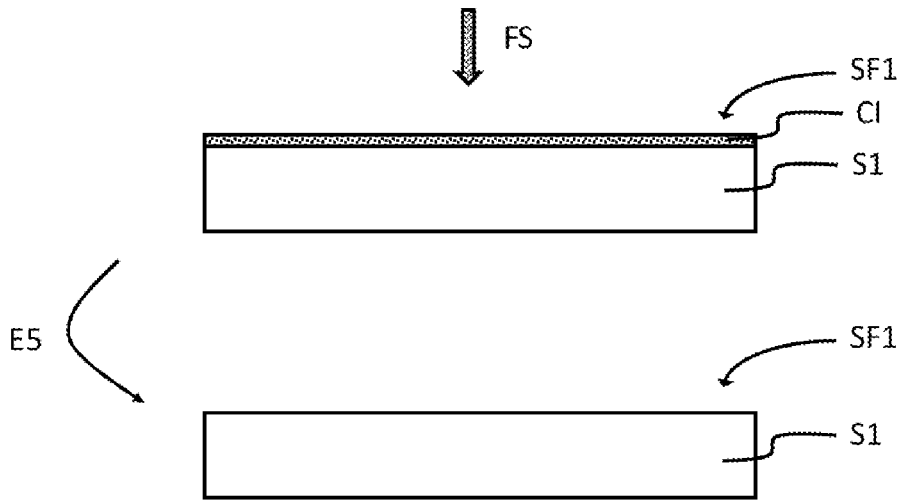
[Fig. 4]
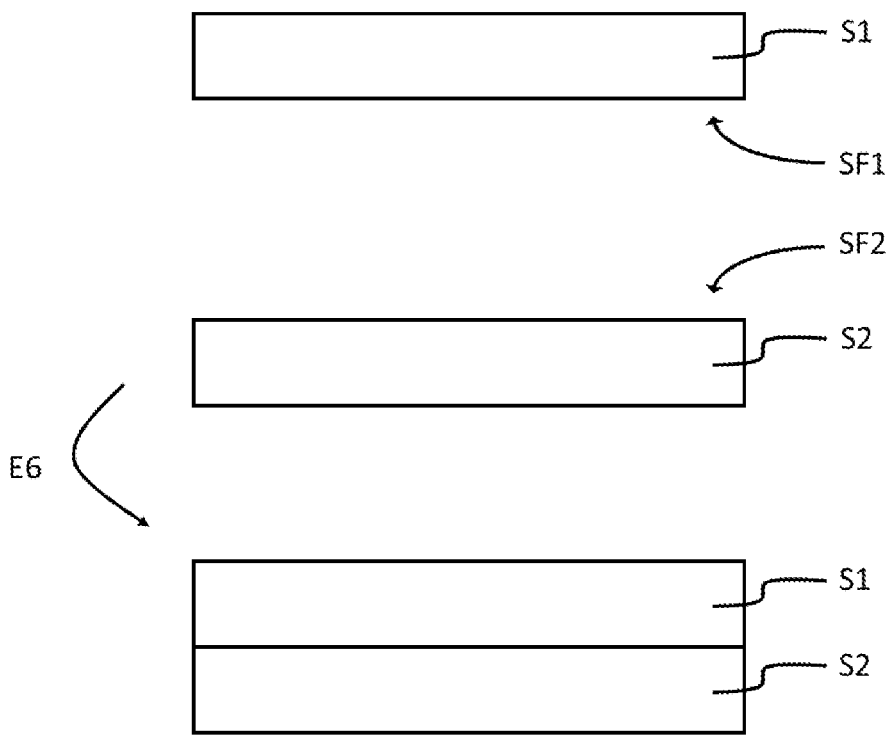

SURFACE ACTIVATED BONDING METHOD BY ION OR ATOM BOMBARDMENT OF A FIRST SURFACE OF A FIRST SUBSTRATE TO A SECOND SURFACE OF A SECOND SUBSTRATE

CROSS-REFERENCE TO RELATED APPLICATIONS

This application claims priority to French Patent Application No. 2201744, filed Feb. 28, 2022, the entire content of which is incorporated herein by reference in its entirety.

FIELD

The technical field of the invention is that of direct bonding.

The present invention relates to a surface activated bonding method and in particular to a bonding method comprising a step of depositing a layer of the species of interest onto at least one of the surfaces to be bonded.

BACKGROUND

Direct bonding is a well-known technique used for industrial applications such as the manufacture of SOI substrates or even imagers for example. Direct bonding consists of spontaneous bonding between two surfaces without material input, especially without a thick layer of liquid. It is nevertheless possible to have some water monolayers adsorbed on the surfaces, but these are macroscopically dry. One of the main characteristics of direct bonding is its adhesion energy or otherwise called its bonding energy. This is the energy that needs to be used to separate the two bonded surfaces. The most common type of direct bonding is bonding of two hydrophilic surfaces at ambient temperature and pressure. To achieve satisfactory bonding energy, these bonds usually need to be annealed beyond 200° C.

Other bonding techniques have also been developed, such as SAB (Surface Activated Bonding) and ADB (Atomic Diffusion Bonding) bonding, which are carried out under ultra-high vacuum. The reader may especially refer to H. Takagi, R. Maeda, T. R. Chung, and T. Suga, Sensors and Actuators A: Physical 70, 164 (1998) and M. Uomoto, A. Muraoka, and T. Shimatsu, ECS Trans. 86, 199 (2018). These bonds have the feature of displaying a very high adhesion energy already at ambient temperature. Very often uniaxial pressure is applied during ADB and SAB bonding, but always at ambient temperature. It is therefore not strictly speaking a question of thermocompression, but of pressure only during direct bonding.

More particularly, in SAB bonding, the surface to be bonded is bombarded with a beam of ions or atoms (very often argon) so as to remove the surface oxides and leave only unpaired pendant bonds (thus activating the surface). By bringing two surfaces thus treated into contact, covalent bonds are obtained directly at the bonding interface. However, this type of bonding suffers from some disadvantages. Especially, if the materials to be bonded are not comprised of a single chemical species, the bombardment does not have the same effectiveness on the different types of atoms that make up the materials, which can lead to roughening that is detrimental to bonding. Above all, this difference in efficiency can lead to a change in the composition of the surface with a depletion of one or more of the species making up the material. For example, SiC becomes depleted in silicon and a carbon-rich layer is found at the interface after bombardment. This layer has a lower mechanical strength than nominal SiC as described in T. Suga and F. Mu, in 2018 7th Electronic System-Integration Technology Conference (2018), pp. 1-4. It is possible to circumvent the problem with the use of a "modified" SAB, where a deposition of another material is made during or before the argon bombardment in order to bond with this new chemical species. This is how silicon oxide or polymers, for example, can be bonded by SAB. Modified SAB is interesting but it requires a particular machine and the species added is found at the bonding interface.

There is therefore a need for a bonding method for limiting depletion of one of the constituents of the surfaces desired to be bonded but without requiring the addition of a third-party layer at the bonding interface.

SUMMARY

An aspect of the invention offers a solution to the problems previously discussed, by making it possible, using a layer of a species of interest before the activation step, to limit depletion of the material. Furthermore, as this layer is entirely consumed upon activation, bonding can be achieved without the presence of a third-party layer at the bonding interface.

An aspect of the invention relates to a surface activated bonding method by ion or atom bombardment of a first surface of a first substrate to a second surface of a second substrate, the material of the first substrate at the first surface comprising at least two chemical species, one of which, referred to as the species of interest, becomes depleted upon activation by ion or atom bombardment, the method comprising:

A step of depositing a layer of the species of interest onto the first surface of the first substrate;

A step of activating the first surface by bombarding the first surface with an ion or atom beam so as to consume the entire previously deposited layer of species; and A step of activating the second surface by bombarding the second surface with an ion or atom beam;

A step of contacting the first surface of the first substrate with the second surface of the second substrate.

Further to the characteristics just discussed in the preceding paragraph, the method according to one aspect of the invention may have one or more complementary characteristics among the following, considered individually or according to any technically possible combinations.

In an embodiment, the method comprises, prior to the deposition step, a step of preparing the first surface and/or the second surface including cleaning said surface(s).

In an embodiment, the method comprises, before the deposition step and after the preparation step if such a step is implemented, a step of preliminarily activating the first surface of the first substrate and/or the second surface of the second substrate.

In an embodiment, the species of interest of the material at the first surface of the first substrate is referred to as the first species of interest and the material at the second surface of the second substrate comprises at least two chemical species, one of which, referred to as the second species of interest, becomes depleted upon activation by ion or atom bombardment, the method comprising before, during or after the step of depositing the layer of the first species of interest onto the first surface of the first substrate, a step of depositing a layer of the second species of interest onto the second surface of the second substrate, the step of activating the second surface being carried out so as to consume the entire layer of the second species of interest previously deposited.

In an embodiment, the method comprises, after the deposition step or steps, a step of annealing the previously deposited layer or layers.

In an embodiment, the activation step is prolonged after consumption of the layer of the species of interest and, where such a layer exists, the layer of the second species of interest, so as to achieve partial etching of the first surface of the first substrate and, when the layer of the second species of interest has been deposited, partial etching of the second surface of the second substrate.

In an embodiment, the material at the first surface of the first substrate and/or the material at the second surface of the second substrate is selected from SiGe, SiC, CGe.

In an embodiment, the preliminary activation step, the deposition step(s), the activation steps and the contacting step are carried out in a surface activated bonding machine comprising a deposition chamber for depositing the layer(s) of the species of interest.

The invention and its different applications will be better understood upon reading the following description and examining the accompanying figures.

BRIEF DESCRIPTION OF THE FIGURES

The figures are set forth by way of illustrating and in no way limiting purposes of the invention.

FIG. 1 shows a flowchart of a method according to an aspect of the invention in which optional steps appear in dotted lines.

FIG. 2 illustrates a step of depositing the layer of the species of interest of the method according to an aspect of the invention.

FIG. 3 illustrates an activation step of the method according to an aspect of the invention.

FIG. 4 illustrate a contacting step according to an aspect of the invention.

DETAILED DESCRIPTION

The figures are set forth by way of illustrating and in no way limiting purposes of the invention.

A first aspect of the invention illustrated in [FIG. 1] to [FIG. 4] relates to a surface activated bonding method 100 by ion or atom bombardment of a first surface SF1 of a first substrate S1 to a second surface SF2 of a second substrate S2, the material of the first substrate S1 at the first surface SF1 comprising at least two chemical species (for example, a binary material), one of which, referred to as the species of interest, becomes depleted upon activation by ion or atom bombardment.

In an embodiment, the species of interest of the material at the first surface SF1 is referred to as the first species of interest and the material of the second substrate S2 at the second surface SF2 comprises at least two chemical species, one of which, referred to as the second species of interest, becomes depleted upon activation by ion or atom bombardment.

In an embodiment, the material at the first surface SF1 of the first substrate S1 and/or the material at the second surface SF2 of the second substrate S2 is selected from SiGe, SiC, CGe, or any other material comprising two chemical species, including the second species of interest, may be deposited. In an exemplary embodiment, the first substrate S1 and the second substrate S2 are SiC substrates, having for example a diameter of 150 mm and a thickness of 325 µm.

Step 1E1 of Preparing the First Surface and/or the Second Surface (Optional)

In an embodiment, the method 100 comprises a step 1E1 of preparing the first surface SF1 of the first substrate S1 and/or the second surface SF2 of the second substrate S2 comprising, for example, cleaning the surfaces in question. In one exemplary embodiment, in this preparation step 1E1, the first and second surfaces SF1, SF2 are cleaned by Caro (a mixture of 96% sulphuric acid and 30% hydrogen peroxide (3:1)) at 140° C. and by SC1 (a mixture of 30% ammonia, 30% hydrogen peroxide and deionised water (1:1:5)) at 70° C.

Preliminary Activation Step 1E2 (Optional)

In an embodiment, the method 100 comprises a step 1E2 of preliminarily activating the first surface SF1 and, possibly, the second surface SF2, for example using an atom or ion beam. This is especially the case when the subsequent deposition step 1E3 is performed in an SAB machine, in which case preliminarily activating is performed using an atom or ion beam. In an exemplary embodiment, the first surface and the second surface are subjected to SAB-type surface activation under ultra-high vacuum (pressure less than or equal to $10^{-8}$ mbar) with an Argon atom or ion beam of 200 eV and 150 mA, the activation time being 1 min.

Step 1E3, 1E3' of Depositing a Layer of the Species of Interest

As illustrated in [FIG. 2], the method 100 according to an aspect of the invention comprises a step 1E3 of depositing a layer CI of the species of interest onto the first surface SF1. In an embodiment, when the material of the second substrate S2 at the second surface SF2 comprises at least two chemical species, one of which, referred to as the second species of interest, becomes depleted upon activation by ion or atom bombardment, the method 100 also comprises a step 1E3' of depositing a layer of the second species of interest onto the second surface SF2. When the first species of interest and the second species of interest are identical, for example because the material at the first surface SF1 is identical to the material at the second surface SF2, these two deposition steps 1E3, 1E3' may be performed simultaneously.

In an exemplary embodiment, the first substrate S1 and the second substrate S2 are of SiC and, in this step, a 10 nm layer of amorphous silicon is deposited onto the first surface SF1 of the first substrate S1 and the second surface SF2 of the second substrate S2. In this example, the deposition step 1E3 is then followed by an annealing step 1E4.

In an alternative exemplary embodiment, the first substrate and the second substrate are disposed in a Surface Activated Bonding (SAB) machine which has a deposition chamber for the deposition of a layer of the species of interest and, in this step, optionally preceded by the preliminary activation step 1E2 as previously described, a 10 nm thick layer CI and CI2 of amorphous silicon is deposited respectively onto the first surface SF1 of the first substrate S1 and the second surface SF2 of the second substrate S2, said deposition 1E3, 1E3' being carried out under an ultra-high vacuum by a technique known as "sputtering" in RF mode with a power of 250 W and under a flow of 50 sccm (for Standard Cubic Centimeters per Minute under standard temperature and pressure conditions) of Argon.

Annealing Step 1E4 (Optional)

In an embodiment, the method 100 also comprises, at the end of the deposition step 1E3, 1E3', an annealing step 1E4. In an exemplary embodiment, the temperature during the annealing step 1E4 is between 600° C. and 800° C., for example 700° C., this temperature being maintained for a time between 5 minutes and 15 minutes, for example a duration equal to 10 minutes.

Steps 1E5, 1E5' of Activating the First Surface and the Second Surface

The method 100 then comprises a step 1E5 of activating the first surface SF1 by bombarding the first surface SF1 with an ion or atom beam FS so as to consume the entire previously deposited layer CI1 of species. It also comprises a step 1E5' of activating the second surface SF2 by bombarding the second surface with an ion or atom beam. In an embodiment, these two steps 1E5, 1E5' are implemented simultaneously.

In an embodiment, when a layer CI2 of the second species of interest has been deposited at the second surface SF2 of the second substrate S2, the step 1E5' of activating the second surface SF2 is implemented so as to consume the entire previously deposited layer CI2 of the second species of interest.

In an exemplary embodiment, when the preceding steps have not been carried out in an SAB machine, the activation steps 1E5, 1E5' are preceded by ultra high vacuuming the first substrate S1 and the second substrate S2. Then, the activation steps are carried out simultaneously or sequentially using a beam of argon atoms or ions of 200 eV and 150 mA, such a beam being associated with an etching speed of 4 nm/min, the duration of these steps being chosen so as to remove the previously deposited layer of the species of interest. For example, for a 10 nm layer, the activation is implemented for 2 minutes and 30 s.

In an embodiment, the activation is prolonged after consumption of the layer IC of the species of interest and, when such a layer exists, of the layer of the second species of interest, so as to achieve partial etching of the first surface SF1 of the first substrate S1 and, when the layer of the second species of interest has been deposited, partial etching of the second surface SF2 of the second substrate S2. This partial etching makes it possible, in particular, to remove the oxide layer likely to be formed before depositing the layer of the first species of interest or the second species of interest.

Contacting Step 1E6

The method 100 then comprises a step 1E6 of contacting the first surface SF1 of the first substrate S1 with the second surface SF2 of the second substrate S2 (see FIG. 4) so as to perform bonding of the first substrate S1 to the second substrate S2.

In an embodiment, the preliminary activation step 1E2, the deposition step 1E3 or steps 1E3, 1E3', the activation steps 1E5, 1E5', and the contacting step 1E6 are performed in a surface activated bonding (SAB) machine comprising a deposition chamber for depositing the layer(s) of the species of interest. Thus, these different steps can be carried out under the same vacuum, in this case an ultra high vacuum, that is without breaking vacuum between these different steps. This makes it possible to obtain surfaces and therefore bonding with a better quality.

The articles "a" and "an" may be employed in connection with various elements and components of compositions, processes or structures described herein. This is merely for convenience and to give a general sense of the compositions, processes or structures. Such a description includes "one or at least one" of the elements or components. Moreover, as used herein, the singular articles also include a description of a plurality of elements or components, unless it is apparent from a specific context that the plural is excluded.

It will be appreciated that the various embodiments described previously are combinable according to any technically permissible combinations.

The invention claimed is:

1. A surface activated bonding method by ion or atom bombardment of a first surface of a first substrate to a second surface of a second substrate, the material of the first substrate at the first surface comprising at least two chemical species, one of which is a species of interest that becomes depleted upon activation by ion or atom bombardment, the method comprising:
   depositing a layer of the species of interest onto the first surface of the first substrate;
   activating the first surface by bombarding the first surface with an ion or atom beam so as to consume the entire previously deposited layer of the species;
   activating the second surface by bombarding the second surface with an ion or atom beam, and
   contacting the first surface of the first substrate with the second surface of the second substrate.

2. The method according to claim 1, further comprising, before the depositing, preparing the first surface and/or the second surface including cleaning said first and/or second surface(s).

3. The method according to claim 1, further comprising, before the depositing and after optionally preparing the first surface and/or the second surface by cleaning, preliminarily activating the first surface of the first substrate and/or the second surface of the second substrate.

4. The method according to claim 3, wherein the species of interest of the material at the first surface of the first substrate is a first species of interest and wherein the material at the second surface of the second substrate comprises at least two chemical species, one of which is a second species of interest that becomes depleted upon activation by ion or atom bombardment, the method comprising, before, during or after the depositing the layer of the first species of interest onto the first surface of the first substrate, depositing a layer of the second species of interest onto the second surface of the second substrate, activating the second surface being carried out in such away as to consume the entire previously deposited layer of the second species of interest.

5. The method according to claim 1, further comprising, after the depositing, annealing the previously deposited layer or layers.

6. The method according to claim 1, comprising partial etching of the first surface of the first substrate by prolonging bombarding of the first surface with the ion or atom beam after consumption of the layer of the species of interest.

7. The method according to claim 1, wherein the material at the first surface of the first substrate and/or the material at the second surface of the second substrate is selected from the group consisting of SiGe, SiC, and CGe.

8. The method according to claim 1, further comprising preliminarily activating the first surface of the first substrate and/or the second surface of the second substrate, wherein the depositing, the activating of the first surface, the activating of the second surface, and the contacting are carried out in a surface activated bonding machine comprising a deposition chamber for depositing the layer(s) of the species of interest.

* * * * *